United States Patent [19]
Russo

[11] Patent Number: 5,969,625
[45] Date of Patent: Oct. 19, 1999

[54] HIGH SENSITIVITY BATTERY RESISTANCE MONITOR AND METHOD THEREFOR

[76] Inventor: Frank J. Russo, 905 Alamanda Dr., North Palm Beach, Fla. 33408-4105

[21] Appl. No.: 08/843,692

[22] Filed: Apr. 16, 1997

Related U.S. Application Data

[60] Provisional application No. 60/015,661, Apr. 19, 1996.

[51] Int. Cl.$^6$ .................................................. G08B 21/00
[52] U.S. Cl. ........................ 340/636; 340/638; 320/116; 320/134; 324/430
[58] Field of Search .................................. 340/636, 638; 320/15, 27, 28, 48, 134, 116; 322/25; 324/426, 434, 430

[56] References Cited

U.S. PATENT DOCUMENTS

| | | | |
|---|---|---|---|
| 4,419,621 | 12/1983 | Becker et al. | 324/51 |
| 4,546,309 | 10/1985 | Kang | 324/52 |
| 4,697,134 | 9/1987 | Burkum | 320/48 |
| 4,968,943 | 11/1990 | Russo | 324/537 |
| 5,055,763 | 10/1991 | Johnson et al. | 320/15 |
| 5,214,385 | 5/1993 | Gabriel | 324/434 |
| 5,281,920 | 1/1994 | Wurst | 324/430 |
| 5,397,991 | 3/1995 | Rogers | 324/434 |
| 5,528,148 | 6/1996 | Rogers | 324/426 |
| 5,574,355 | 11/1996 | Deshane | 320/39 |
| 5,602,459 | 2/1997 | Rogers | 320/15 |
| 5,610,499 | 3/1997 | Rogers | 322/25 |
| 5,717,937 | 2/1998 | Fritz | 395/750.01 |

OTHER PUBLICATIONS

Ratelco Battery Sentry Spec., Circa 1996.
Determining the End of Battery Life by S. DeBardelaben, pp. 365–368, IEEE, 1986.
Midtronics Battery Conductance Monitoring & Control System Spec., Circa 1996.
CEL1–CHK Battery Monitor Model X–180 Spec., Circa 1996.
Albercorp, FD–200 and FD–200 Battery Fault Detector Spec, Circa 1996.
Impedance Testing is the Coming Thing for Substation Battery Maintenance, by P. Kelleher et al., Transmision & Distribution, pp. 68–72, Nov. 1991.
Battery Impedance Monitoring . . . An Added Dimension, by G. Markle, http:www.btech DNC., Com, Aug. 1996.
GEC Measurements Battery Alarm Product Spec and Description, Sep. 1988.

*Primary Examiner*—Edward Lefkowitz
*Assistant Examiner*—Davetta Woods
*Attorney, Agent, or Firm*—Robert C. Kain, Jr.

[57] ABSTRACT

The method and the apparatus for detecting a deteriorating condition in a bank of standby batteries includes injecting an audio frequency current into one of the battery buses or cables, detecting an audio frequency current signal, matched to the injected audio frequency current signal, that is carried by the battery bus and detecting a voltage drop, at the audio frequency, across the bank of standby batteries. In one embodiment, current transformers are utilized in connection with an oscillator (to inject the AF current signal) and detection circuits (comparators and operational amplifiers) are utilized to generate a representative current signal and a representative voltage signal. The device detects when the standby batteries are operating in a normal, stable condition, that is, when the bank is neither being recharged nor is discharging DC power to the load. During normal, stable operating conditions, a differential relationship is established between the representative voltage and representative current signals. In one embodiment, a microprocessor-based system monitors the float voltage of the battery in order to ascertain when the battery system is in a normal, stable operating condition. The microprocessor also initially establishes the differential between the representative voltage and the representative current signals. The method includes determining when the differential relationship between the voltage and current signals exceeds a predetermined value and issues an alarm signal at that time. The alarm signal may be deferred until the differential relationship exceeds the predetermined value for a predetermined period of time. In one embodiment, this analysis is conducted in the microprocessor-based system.

21 Claims, 5 Drawing Sheets

HIGH SENSITIVITY BATTERY RESISTANCE MONITOR AND METHOD THEREFOR

This application claims the benefit of and is based upon provisional patent application no. 60/015,661 filed on Apr. 19, 1996.

The present invention relates to a battery monitor which is very sensitive to a change in resistance in large standby batteries commonly used in telecommunications systems, utility substations and in power plants. The invention also relates to a method for sensing a deteriorating battery condition.

BACKGROUND OF THE INVENTION

DC power is needed for many types of telephone communication equipment and for control equipment used at electric utility substations and power plants. The DC power, required for this communication equipment and control equipment used at utility substations and power plants, is normally supplied by a DC power source which, in turn, is supplied with AC power from an AC power source. A typical DC power source for these applications is a battery charger.

A bank of standby batteries is utilized as a backup DC power source when the normally AC powered, DC power source either cannot supply all the power required by the components or when the AC power supply goes off line, as during a power failure at the local electric utility.

Standby storage batteries are designed to deliver energy to a load over a relatively long period of time at a slowly declining voltage, in contrast with the short-duration, high energy discharge typically provided by automotive batteries. Each standby storage battery includes one or more electrochemical cells, with multiple cells being connected in series so that the overall voltage, measured across the battery terminals, is equal to the sum of the individual cell voltages. Individual batteries are further connected together in series to form a battery bank having a higher voltage.

The potential difference, or voltage difference or differential, measured across the positive and negative terminals of a battery cell, is a characteristic of the particular chemistry of that cell. For example, in lead-acid batteries, the open circuit cell voltage is approximately 2.0 volts, while in a nickel-cadmium cell, the potential difference is approximately 1.2 volts. In each cell, positive and negative reactants, or active materials, are bound into a number of metallic grids to form positive and negative plates, respectively. Plates of like polarity are attached to a rigid, metallic supporting strap, which is fitted with a terminal post for connection to external loads. The assemblies of positive and negative plates with their respective straps and terminal posts are suspended in a jar or container containing a solution, which is an electrolyte, and the plates are separated by insulating material to ensure that no direct contact occurs between plates of opposite polarity. Such contact between the plates would result in a short circuit which would quickly discharge the cell, rendering it useless. The jar or other type of container is permanently sealed by means of a cover with holes therethrough. The positive and negative terminal posts protrude through these holes or openings.

When an electric load is connected between the positive and negative terminals of the battery, a spontaneous chemical reaction occurs between the electrolyte and the active materials in the battery plates and causes an electric current to be delivered into the load. The battery discharges by delivering DC current to the connected load. While the battery discharges, its terminal voltage gradually declines.

The chemical reaction in the battery is reversible, i.e., nearly all of the energy removed from the battery during discharge can be returned by forcing a charging current of opposite polarity through the battery. The ability of a stationary storage battery or standby battery to deliver energy to a load, i.e., the battery's capacity, is defined by a non-linear relationship of battery voltage to the duration and magnitude of discharge current. This battery capacity is commonly expressed in ampere-hours (AH). For example, if the starting terminal voltage of a fully charged 100 AH lead-acid battery is 2.22 volts, and if the nominal discharge voltage is 1.75 volts, the battery can typically supply a current of approximately 12 amperes continuously for 8 hrs. before its terminal voltage reaches 1.75 volts. At 24 amperes, however, the voltage may decline to 1.75 volts in only two to three hours. Manufacturers generally develop and supply charts showing curves and tables relating current, time and voltage for their batteries. Other factors which may affect battery capacity include temperature, thickness of the active material in the plates, plate surface area in contact with the electrolyte, specific gravity of the electrolyte and the internal resistance of the cell.

A storage battery, like any source of electrical energy, has an internal impedance, which includes resistive, inductive and capacitive components. When the battery is discharging only direct current or DC is involved; capacitive and inductive components of the impedance have no effect on the power delivered by the battery. As the battery discharges, the current produces a voltage drop across the internal resistance of the battery in accordance with Ohm's law. This voltage drop causes the voltage across the battery terminals to be somewhat less than an "ideal", that is, the expected voltage, and the voltage drop consequently diminishes the ability of the battery to power the load. The internal resistance of a storage battery at the time of manufacture is made as low as possible to minimize the voltage dropped during battery discharge. A typical 200 AH lead-acid battery may have an initial internal resistance as low as 0.5 milliohms. Over the life of the battery, however, the internal resistance will increase, at a rate determined by such factors as how many times the battery undergoes cycles of discharging and recharging, the effects of continuous charging on the electrical conductivity of internal cell connections (e.g., electrochemical corrosion of the positive grid alloy), and the temperature of the electrolyte. The internal resistance of any cell will eventually increase to a level where the voltage drop across it during discharge is so great that the battery can no longer deliver power at its rated capacity. It is typical for batteries to be replaced when actual capacity falls to 80% of rated capacity, as determined by a controlled discharge test.

In most cases, internal cell resistance will not cause serious problems until the battery is near the end of its useful life, typically 12 to 15 years. In some cases, however, an increase in internal resistance of a cell will be abnormally rapid. Within only one or two years of its life, the cell resistance will become high enough such that heating effects from high discharge currents (so-called ohmic, or $I^2R$, heating) will melt or vaporize metallic connections among internal cell components, causing the battery circuit to open. An increase of only 500 milliohms in the internal resistance of a 200 AH lead-acid battery bank, for example, could result in such an open circuit under heavy load. A frequent cause of rapidly increasing cell resistance may be due to defects in the manufacturing process, including a faulty connection of internal cell elements, improper plate formation and certain deficiencies of the grid alloys.

If the battery circuit opens (an internal battery condition), it will no longer be able to discharge power into the load, and will consequently be useless as a standby energy source. Moreover, flammable gases released during charging reactions may accumulate within the battery jar or container, and may ignite when internal connections burn (by ohmic heating), causing an explosion that may damage equipment and seriously injure personnel. It is, therefore, very advantageous to have advance warning of an abnormal increase in cell resistance.

U.S. Pat. No. 4,968,943 to Russo discloses an open battery bank detector. Russo's non-intrusive open battery bank detector senses an alternating current component of the DC trickle charge carried by one of a pair of cables connected between the battery charger and the bank of batteries. When the AC component reaches a threshold level, a sensor circuit trips a relay which activates an alarm.

U.S. Pat. No. 4,546,309 to Kang discloses an apparatus and a method for locating ground faults. The Kang device utilizes a low frequency current generator having a variable output, a Hall-effect current probe for detecting the low frequency current produced by the generator, a filter and an amplifier connected to the output of the Hall-effect current probe for identifying and amplifying the low frequency signal. A readout element is connected to the output of the amplifier to indicate the relative magnitude of the low frequency signal.

U.S. Pat. No. 4,697,134 to Burkum discloses an apparatus and a method for measuring battery condition. The Burkum device measures the impedance of secondary cells that form the battery. The impedance measurement is made at a frequency selected to be different from those frequencies otherwise present in the charger-load circuit. A first application of the testing device monitors the battery for a change in impedance that can signal a developing defect in one or more individual cells or intercell connections. In a second application, the testing device is utilized to compare the impedance of individual cells and electrical connections to locate faulty components. A digital measurement of the measured AC current at the selected frequency is supplied to a computer or a digital system. A digital version of the measured voltage across the battery at the selected frequency is also supplied to the computer. The computer divides the voltage by the current measurement and records or logs the resulting impedance value on a regular basis.

U.S. Pat. No. 5,214,385 to Gabriel discloses an apparatus and a method for utilizing a polarization voltage to determine charge state of a battery. The test signal is a continuous square wave signal having a frequency less than 3 Hz. The test signal alternates between a voltage adequate to charge the battery and a lower voltage. The charging voltage is retained for a time sufficient to allow a polarization voltage to develop across individual battery cells.

U.S. Pat. No. 5,281,920 to Wurst discloses an on-line battery impedance measurement device. The impedance of battery cells within a battery bank is measured by dividing the bank into at least two battery strings. A load current is imposed on one of the battery strings and the battery cell voltage is measured within that string.

U.S. Pat. No. 5,574,355 to McShane discloses a method and an apparatus for the detection and control of thermal runaway in a battery under charge. The circuit determines the internal resistance or impedance and conductance (admittance) of the battery during the charge cycle. Since the charging current to the battery increases with time under a thermal runaway condition, a variable voltage source is connected between a regulator, which measures the voltage between the terminals of a battery and controls the voltage of the voltage source charging the battery, and the battery bank. The variable voltage source is connected between that regulator and the battery and introduces an offset voltage. By increasing the apparent voltage measured by the regulator between the battery bank terminals, the variable voltage source can be used to regulate the primary voltage source and thus reduce the charge applied to the battery upon detection of an impending thermal runaway condition. A microprocessor determines the conductance of the battery bank by applying a current pulse to the system with a current source. Conductance is the change in current flowing through the battery due to the current source divided by the change in the voltage of the battery due to the applied change in current. The microprocessor can also utilize impedance to detect a deteriorating condition. Thermal runaway is detected by the microprocessor when the absolute or relative conductance/impedance value exceeds a threshold, when the rate of change in the conductance/impedance exceeds a threshold, or a relationship between the ambient temperature (as measured by a temperature sensor) and the battery conductance/impedance exceeds a threshold. Upon detecting a thermal runaway condition an alarm is sounded.

OBJECTS OF THE INVENTION

It is an object of the present invention to provide a relatively inexpensive yet highly sensitive battery monitor system for standby batteries.

It is another object of the present invention to provide a monitor system which monitors a resistance component of the standby battery bank by monitoring the relationship between a voltage drop across the entire battery bank, based upon an audio frequency (AF) injected current, and a detected audio frequency current which is also based upon the injected AF current.

It is a further object of the present invention to disable the alarm system during charging or discharging of the battery bank.

It is an additional object of the present invention to monitor the proportional relationship between a detected audio frequency current which results from an injected AF current, and a voltage drop or differential of an audio frequency voltage signal across the battery bank.

It is another object of the present invention to provide a battery monitoring system which can be coupled to other transducers or sensors which monitor DC charging currents and discharging currents, ambient temperature and DC bus to ground voltage.

SUMMARY OF THE INVENTION

The method and the apparatus for detecting a deteriorating condition in a bank of standby batteries includes injecting an audio frequency current into one of the battery buses or cables, detecting an audio frequency current signal, matched to the injected audio frequency current signal, that is carried by the battery bus and detecting a voltage drop, at the audio frequency, across the bank of standby batteries. In one embodiment, current transformers are utilized in connection with an oscillator (to inject the AF current signal) and detection circuits (comparators and operational amplifiers) are utilized to generate a representative current signal and a representative voltage signal. The device detects when the standby batteries are operating in a normal, stable condition, that is, when the bank is neither being recharged nor is discharging DC power to the load. During normal, stable operating conditions, a differential relationship is established between the representative voltage and representative current signals. In one embodiment, a microprocessor-based system monitors the float voltage of the battery in order to ascertain when the battery system is in a normal, stable operating condition. The microprocessor also initially establishes the differential between the representative voltage and the representative current signals. The method includes determining when the differential relationship between the voltage and current signals exceeds a predetermined value and issues an alarm signal at that time. The alarm signal may be deferred until the differential relationship exceeds the predetermined value for a predetermined period of time. In one embodiment, this analysis is conducted in the microprocessor-based system.

BRIEF DESCRIPTION OF THE DRAWINGS

Further objects and advantages of the present invention can be found in the detailed description of the preferred embodiments when taken in conjunction with the accompanying drawings in which.

DETAILED DESCRIPTION OF THE PREFERRED EMBODIMENTS

The high sensitivity battery monitor system or HSBRM is designed to detect an increase of as little as 5 milliohms in the resistive component of the impedance of the overall battery bank conduction path (including battery cells, connecting cables and terminations to battery posts), and it is especially well suited for float charging applications.

Figure 1:
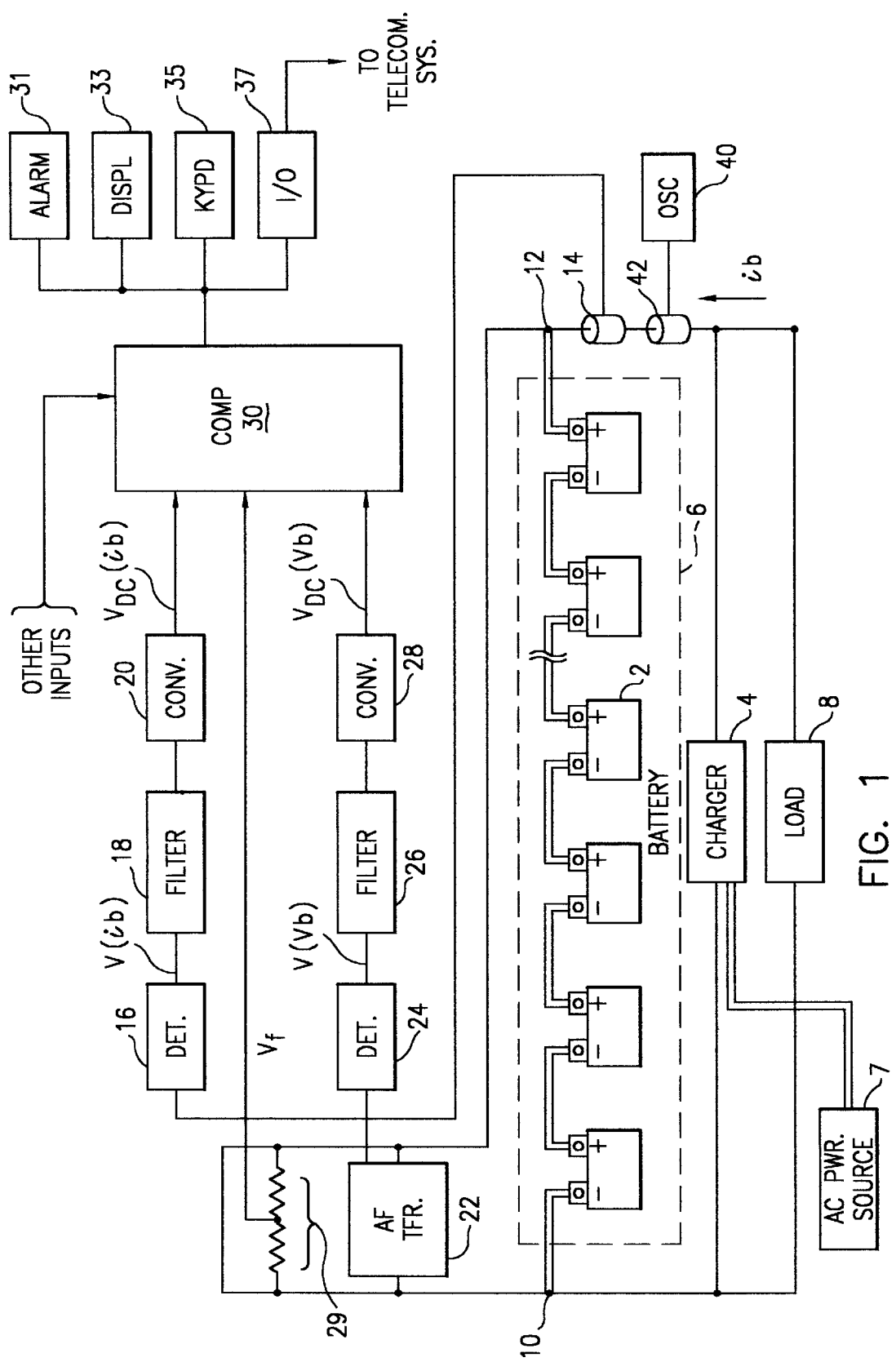
FIG. 1 diagrammatically illustrates, in block diagram form, the high sensitivity battery monitor system and the method of operation and the associated environment in accordance with the principles of the present invention.

FIG. 1 shows, in block diagram form, the monitor system and the associated environment. In float charging, a number of stationary standby batteries 2 are connected in series to form a battery bank 6 having a desired overall voltage. Battery bank 6 is one component of a DC power system including an AC powered battery charger 4 which can be adjusted to provide a constant DC output voltage, up to a fixed output current limit, and a system load 8, which includes DC powered equipment. DC powered equipment includes telephone communication equipment and equipment utilized to protect and control electric utility substation devices and power plant facilities. AC power, from AC source 7, is supplied to charger 4. The battery bank 6 is connected in parallel with the DC system load 8 and the output terminals of the battery charger are connected to battery bank terminals 10, 12.

During normal operation, the battery charger 4 supplies power to the system load 8 and supplies a small direct current to the battery bank 6. This trickle charge current is sufficiently large in magnitude to prevent the reduction in battery cell voltage arising from natural losses (cell local action) within the cells. In this condition, the batteries are said to float, and the charger output is controlled so as to maintain the DC system at a desired nominal float voltage. For example, a battery bank in optimum condition comprising 60 lead-acid battery cells at a rated capacity of 100 ampere-hours may be float charged at a voltage of 133 volts DC, or approximately 2.22 volts per cell, and may draw a direct charging current of approximately 10 milliamperes at 77 degrees Fahrenheit. In the industry and with respect to the present invention, this nominal charging current is not considered to be part of a recharging cycle of the battery bank.

FIG. 1 shows a typical DC power system incorporating a float charged storage battery bank 6. If the charger 4 shuts off, or if special circumstances (such as tripping large circuit breakers or turning on motors) cause the amount of current required by the system load to exceed the output current limit of the battery charger, then the battery bank 6 will instantaneously supply the required power by discharging into the system load 8. Thus, the battery bank serves as a back-up energy source to power the DC system. As the battery bank 6 discharges, the DC system voltage will decline in accordance with the manufacturer's discharge curves for battery cells having a particular chemistry, construction and capacity. When the system load 8 returns to its normal level, current from the battery bank 6 is no longer needed and the DC system voltage will gradually return to the normal float level as the charger 4 recharges the batteries. The current delivered to the battery bank 6 at the onset of recharging, when the bank voltage is low, is typically much higher than the float charging current and may start out approximately equal to the difference between the output current limit of the charger 4 and the normal station load current, eventually tapering off to the small, normal float charging current as the system voltage returns to the nominal float value. The time for the battery charging current to return to its normal float level during recharging is determined primarily by the amount of stored energy delivered by the battery bank during the discharge period, which is reflected in the magnitude of the drop in voltage from the nominal float charging voltage level.

While the battery is either discharging or recharging, the chemical reaction of the active materials in the battery grids and the heating of metallic connections within the battery cells, by currents that are typically hundreds of times higher than the float charging current, will cause the resistance of the battery conduction path to exceed, temporarily, the resistance that would be measured during a sustained period of normal float charging. However, during discharging or charging of the battery bank, the DC system voltage will also be lower than the nominal float value. Therefore, to prevent false alarms due to temporary resistance increases during charging or discharging, the battery monitor system of the present invention suspends checking of the battery conduction path resistance whenever the DC system voltage falls below 98% of the nominal float level. The monitor system, via computer 30, determines when $V_p$, a signal representative of the voltage drop across bank 6, falls below a predetermined level. Steady-state phasor quantities are represented herein in bold face type.

Figure 2:
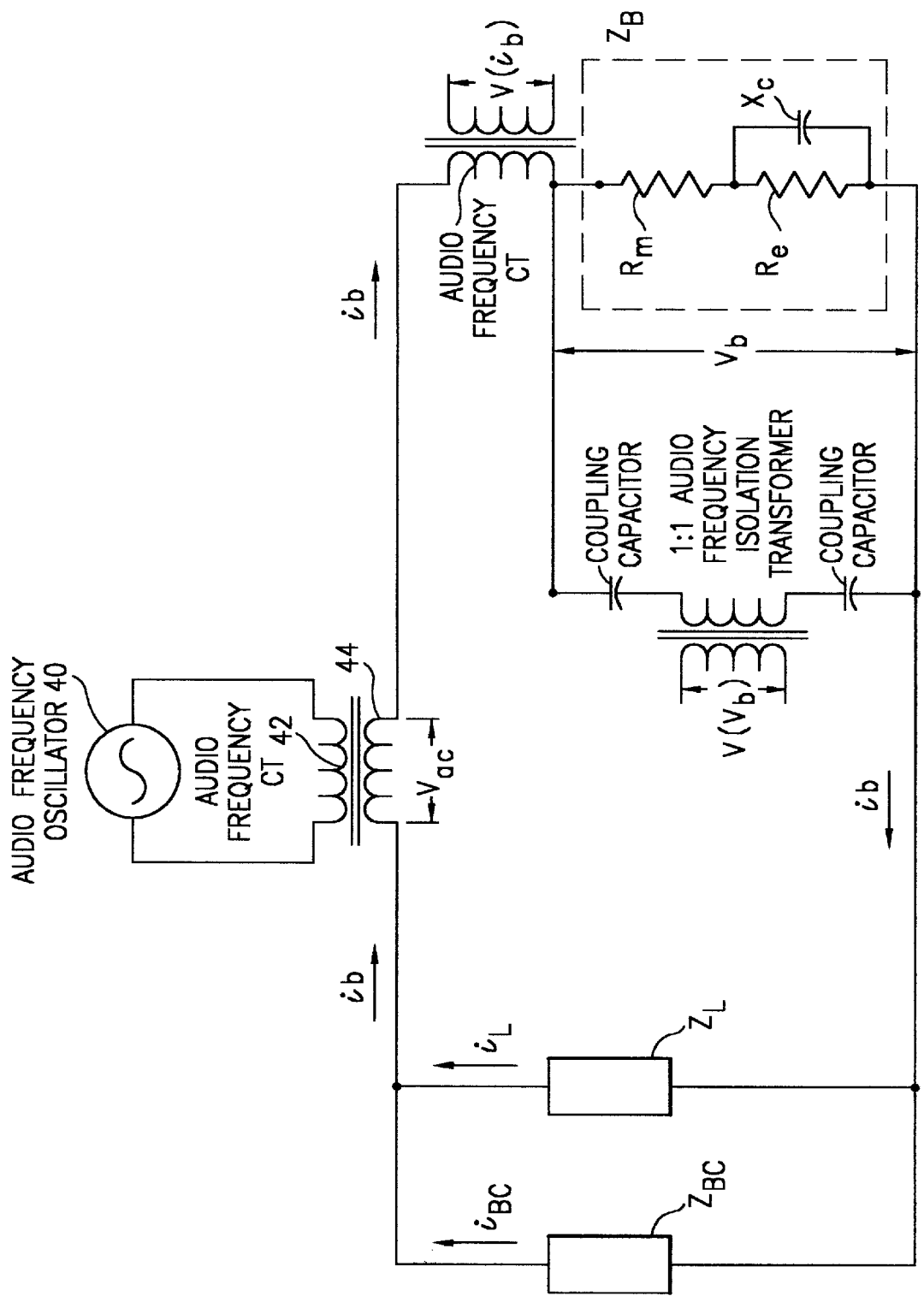
FIG. 2 schematically illustrates the equivalent circuit for the monitoring system and assists in the explanation of the operation of the monitoring system.

The equivalent circuit model of FIG. 2 illustrates the basic operating principles of the battery monitor system in accordance with the present invention. An alternating voltage from an audio-frequency, oscillating source 40 is applied to the input winding of a current transformer (CT) 42. The current transformer 42 is a toroidal design, resembling a doughnut in shape, and its core may consist of a single piece of ferrite, powdered iron composite or other magnetic material, upon which is wound a specific number of turns of wire to form a winding. The core may also comprise two individually wound, symmetrical pieces, which, when pressed together from opposite sides of the battery cable, form a single CT core, with the individual windings connecting electrically to form a continuous single winding. In one embodiment, 18 windings are utilized on two symmetrical c-form cores. In either case, the battery cable passes through the central aperture (or window) in the CT.

The voltage impressed upon the input winding of the CT 42 by the oscillator 40 results in an output voltage signal, $v_{ac}$, at the same frequency, being induced in the section of the battery cable passing through the window of the CT (See FIG. 1). The section 44 of battery cable electrically functions as a single-turn output winding of the CT 42 and acts as a source of signal $v_{ac}$. Further, an alternating current, $i_b$, circulates in the DC system, in response to $v_{ac}$. The internal impedance of source voltage $v_{ac}$ is small enough to be neglected in this analysis. The impedance of the DC system load 8 is represented by $Z_L$, the output impedance of the battery charger 4 is $Z_{BC}$ and the impedance of the battery conduction path is $Z_B$.

The resistance components of $Z_B$ (the battery bank) are further delineated by a metallic resistance, $R_m$ and an electrochemical resistance $R_e$. Resistance component $R_m$ is first developed in the metallic connections by the internal elements of each battery cell, which include the positive and negative plate grids (into which the active materials are pasted), rigid straps to which the plate grids are welded (these support the grids of like polarity in the electrolyte solution), and terminal posts connecting the straps to the outside of the battery for connection to external circuits. $R_m$ is further developed by the connections between the active material paste and the plate grid, and in the external hardware connections and cabling between cells. The electrochemical resistance component, $R_e$, is a measure of the resistance between the electrolyte and the grid, and is effectively in parallel with the large capacitance of the plates. In fact, the plate capacitance is generally large enough such that its reactance, $X_c$, effectively shorts out $R_e$ with respect to $i_b$, at the frequency of signal voltage $v_{ac}$, thus preventing detection of changes in $R_e$ by the battery monitor system. However, $R_e$ is primarily a function of the cell manufacturing process, and it is typically less than 1% of $R_m$. In general, if no abnormally high cell resistances are found during the first discharge test or during the initial resistance or impedance measurement of the battery bank, $R_e$ normally does not present any subsequent problems. The high input impedance of an operational amplifier is reflected through the secondary of the isolation transformer, making the portion of $i_b$ in the primary winding of the isolation transformer so small that essentially all of $i_b$ goes through the battery circuit. This is why $i_b$ is shown unchanged in the batter conduction path.

The detection function of the battery monitor system of the present invention primarily focuses on increases in $R_m$, which are generally caused by natural electrochemical and mechanical changes, such as corrosion of the positive grid and loss of active materials from the plate grids as the cells age and undergo repeated cycles of discharge and recharge.

Source voltage $v_{ac}$ is divided by $Z_B$ and the parallel combination of $Z_L$ and $Z_{BC}$ to produce a voltage signal $v_b$ across $Z_B$ (i.e., across the positive and negative DC bus terminals 12, 10 of the battery bank 6). Alternating current $i_b$ passes through $Z_B$, divides into components $i_{BC}$ and $i_L$ in the parallel circuit consisting of the battery charger's output impedance and the system load, and returns to the CT source. During normal float charging of the battery bank, the parallel combination of $Z_L$ and $Z_{BC}$ changes very little, and can be treated as an approximately constant impedance. When $R_m$ increases, the magnitude of $Z_B$ increases, and since the magnitude of the parallel combination of $Z_L$ and $Z_{BC}$ is essentially unchanged, the proportion of $v_{ac}$ dropped across $Z_B$, i.e., $v_b$, will increase, by voltage divider action. At the same time, the total impedance increases, so that $i_b$ must decrease from its initial steady-state value, by Ohm's Law. To detect the relationship between $v_b$ and $i_b$, the battery monitor system of the present invention develops an analog signal representing $v_b$, denoted by a voltage $v(v_b)$ and an analog signal representing $i_b$, denoted by a voltage $v(i_b)$. Representative signals $v(v_b)$ and $v(i_b)$, which mirror the behavior of $v_b$ and $i_b$, are then converted to DC voltage levels $V_{DC}(i_b)$ and $V_{DC(vb)}$ respectively, for comparison by a microcomputer.

FIG. 1 shows a block diagram of the monitor system. Representative signal $V_{DC}(i_b)$ is generated in the following manner. An audio frequency AF current transformer 14 senses the injected current signal $i_b$. A signal current detection circuit 16 is set to detect the audio frequency of $i_b$ (an audio signal up to generally 20 KHz). Signal current detection circuit includes a gain control element. The output of current detector 16 is applied to a bandpass filter 18. Filter 18 is an R-C active bandpass filter. The output of filter 18 is applied to a converter 20. Preferably, an RMS to DC voltage converter is utilized. In one embodiment, bandpass filter 18 utilizes an integrated circuit (I.C.) LM324 manufactured by National Semiconductor. Converter 20 is an AD536 manufactured by Analog Devices. Other circuits may be utilized. For example, discrete logic circuits may be utilized. Also, comparators adjusted to detect the relationship of the representative voltage and current signals may be utilized. The representative signal $V_{DC}(i_b)$ is applied, via a digitally controlled multiplexing switch MUX to computer or microprocessor system 30.

Representative signal $V_{DC}(v_b)$ is generated as follows. An audio frequency (AF) voltage transformer 22 is connected, via DC blocking coupling capacitors (not shown), between battery bank terminals 12, 10. In one embodiment, current transformer 42 is similar to current transformer 14 which is also similar to voltage transformer 22. A voltage detector 24 is connected to AF transformer 22. Detector 24 is set to detect the voltage of the monitor's audio frequency. In one preferred embodiment, this frequency is 8 KHz. Detector 24 includes a gain control element. The output of detector 24 is fed to filter 26. That filter is a bandpass filter which, in the preferred embodiment excludes signals beyond the 7–10 KHz. range or bandwidth. The LM324 I.C. is utilized in one embodiment. The output of the filter is fed to a converter 28. This converter is an RMS to DC voltage converter and may be an AD536 I.C.

The voltage derived from the signal current detector is amplified and this $v(i_b)$ is supplied to the input of a bandpass filter (utilizing an LM324 integrated circuit from National Semiconductor). Likewise the voltage signal derived from voltage across the batteries $v(v_b)$, which is an amplified sine wave, is applied to the input of another bandpass filter chip. Two bandpass filters are separately utilized in each signal channel. The bandpass filters limit the range of frequencies to anywhere from about 7 to 10 KHz. In this manner, the filters eliminate extreme noise from the signals. There is a lot of noise carried by the signals in power substations. The selected AF frequencies pass through the bandpass filters. The sine wave signal $V(i_b)$. corresponding to the amplified current signal, is fed to an RMS to DC converter (an integrated circuit, Model no. AD536, from Analog Devices). The converter takes a sine wave and generates a DC value which is exactly equal to the RMS value of the sine wave. For example, for a 2.0 volt, peak to peak sine wave, that is a 1.0 volt peak, or 0.707 volts RMS, the converter generates 0.707 volts DC.

Computer system 30 also receives a signal representative of the floating voltage. This representative signal $V_f$ is obtained from a voltage divider circuit 29 connected between terminals 12, 10. Computer system 30 includes an alarm 31, a display 33, a keypad or keyboard input 35 and an input/output device (a modem) 37. I/O device 37 is connected to a telecommunications system (a phone line or other telecommunications device).

Just prior to installation of the battery monitor system described herein, it is necessary to determine that none of the batteries in the bank 6 has an abnormally high internal resistance. This determination can be made either by performance of a capacity discharge test on the battery bank, or by measurement of the internal resistance of each battery cell (with an Albé,er Corp Cellcorder, for example). Any cells showing abnormally high internal resistance are replaced until the internal resistance of each cell in the bank falls within an acceptable range generally established by the manufacturer and accepted by industry practice. The sum of the internal resistances of all the battery cells (which individual resistances need not be known precisely) now represents an initial, baseline conduction path resistance for the battery bank as a whole.

At this time, with the battery bank in its normal float charging mode, the amplitudes of $v(i_b)$ and $v(v_b)$ are adjusted so that the amplitude of $v(i_b)$ exceeds the amplitude of $v(v_b)$ by a small amount, typically 25 to 30 millivolts, causing $V_{DC}(i_b)$ to exceed $V_{DC}(v_b)$ by approximately the same amount. These are the baseline values of $v(i_b)$ and $v(v_b)$. The baseline values are stored in computer system 30. The baseline values establish a signal differential. As explained above, $R_m$ rising above its baseline value will cause the amplitude of $v_b$ to exceed its baseline value, causing an increase in the amplitude of representative signal $v(v_b)$, and therefore an increase in the level of $V_{DC}(v_b)$. At the same time, the increase in $R_m$ will cause the amplitude of $i_b$ to fall below its baseline value, causing a decrease in the amplitude of representative signal $v(i_b)$, and therefore a decrease in the level of $V_{DC}(i_b)$.

The microcomputer 30 within the battery monitor system monitors the DC system voltage $V_f$, and periodically samples DC voltage levels $V_{DC}(i_b)$ and $V_{DC}(v_b)$. So long as the DC system voltage is at least 98% of the nominal float value represented by $V_f$, indicating that the battery is neither discharging nor recharging, the microcomputer will periodically sample the levels of $V_{DC}(i_b)$ and $V_{DC}(v_b)$, and increment a counter register in the microprocessor's memory unit for each consecutive sample in which $V_{DC}(i_b)$ exceeds $V_{DC}(v_b)$, indicating an increase of at least 5 milliohms above the baseline value of battery conduction path resistance. Whenever the sampled value of $V_{DC}(i_b)$ exceeds the sampled value of $V_{DC}(v_b)$, indicating normal system resistance, or the DC system voltage falls below 98% of the nominal float value, the counter is reset to zero. When the number of consecutive samples, representing a condition in which $V_{DC}(v_b)$ exceeds $V_{DC}(i_b)$ by the predetermined amount, counted by the counter, exceeds a preset limit, the microcomputer issues an alarm which activates a display and activates one or more contacts for local and remote alarm annunciation, and activates a modem if the system is so equipped, for remote communications and paging or remote alarm annunciation.

An important difference between the present battery monitor system and more expensive impedance measuring devices is that the present battery monitor system is designed to detect an unacceptable increase in the internal metallic resistance of the overall battery conduction path. In contrast, impedance measuring devices are designed to provide a fairly precise measurement of individual cell impedances. The expensive impedance devices are designed to alert the customer to increases in both the metallic bank resistances and the cell electrochemical resistances, the latter being primarily responsible for eventual open battery circuits and the former for contributing to reduced battery capacity as the cells approach the end of their useful life, typically within 10 to 15 years.

The battery monitor system of the present invention alerts the customer that something is causing an abnormally rapid increase in the metallic internal resistance component of one or more cells, or that a battery connection is failing, in the shorter term, about 1 to 5 years. Also, the more expensive impedance devices may be able to detect resistance increases on the order of 0.5 milliohms, compared to 5 milliohms for the present battery monitor system. Tests have shown that the 5 milliohm detection capability is adequate since a 5 milliohm increase is still not enough, in nearly all cases, to produce dangerous heating effects under load. Moreover, field test measurements of the internal resistances of lead-acid batteries, the most common type used in the telephone and electric utility industries, reveal that a 10 milliohm internal increase within 1 to 5 years is very typical of cells which pose a threat of eventual open circuit failure or sudden voltage drop to nominal discharged battery level under load (indicating less than 5% of rated capacity).

Another difference between the present invention and impedance measuring devices is that prior art impedance devices require connection to the individual batteries of the bank, or to groups of batteries, and use harnesses of connecting leads, which makes installing these a much more time-consuming and more hazardous job. The battery monitor system in accordance with the principles of the present invention, by contrast, if no optional DC current measuring transducer (non-separable core) is used in conjunction with it, can be installed without disturbing battery connections any more than slightly loosening the positive and negative DC bus terminal connections for attachment of the bank voltage sensing leads.

Figure 3:
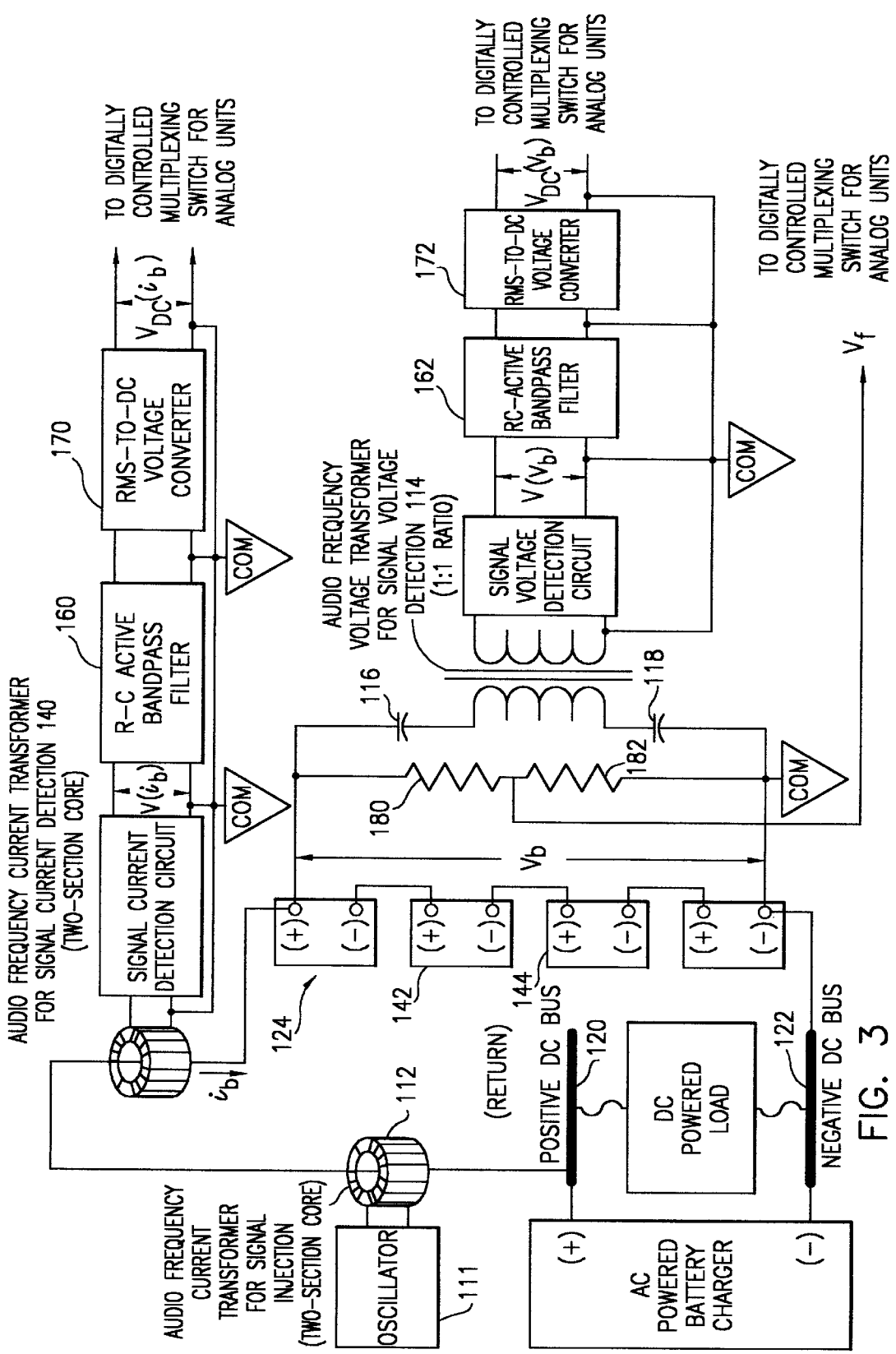
FIG. 3 diagrammatically illustrates a more detailed drawing of the battery monitoring system.

One application of the battery monitor system is illustrated in FIG. 3. In this application, the output voltage signal of the audio frequency oscillator 111 is connected to the primary winding of an audio frequency current transformer 112 with a two-piece core. Each of the two core pieces is wrapped with tape, and then tightly wound with 9 turns of #24 AWG, enamel-insulated magnet wire. When the two core pieces are pressed together from opposite sides of the battery cable, the windings on the two core pieces are electrically connected, via pin jacks, and the core pieces nearly touch, being separated by the width of the wrapping tape. This separation is significant in that it creates a tiny air gap which limits the development of magnetic flux in the core, preventing core saturation problems during excitation by either the oscillator signal, transient currents associated with load switching, or high currents associated with charging and discharging the battery bank. The battery cable now passes through the axial window of the CT 112, forming a single-turn secondary winding. When the oscillator 111 is turned on, $v_{ac}$ is induced across the section of the battery cable that is encircled by the primary winding, causing current $i_b$ to circulate in the DC system as described above.

Analog or representative signal $v(v_b)$ is developed in the following manner: the input leads of a 1-to-1 ratio, audio frequency isolation transformer 114 are connected through coupling capacitors 116, 118 and suitable fuses (not shown), to the positive and negative DC bus terminals 120, 122 of the battery bank 124. When $i_b$ is present in the DC system, $v(v_b)$ is present at the output leads of the isolation transformer. The coupling capacitors pass audio frequency signals while blocking DC current, thus preventing the batteries from discharging through and subsequently destroying the isolation transformer 114 (the windings of which present a short circuit to DC voltage).

Analog or representative signal $v(i_b)$ is developed in the following manner: a second split-core, audio frequency CT 140, essentially identical to the one used to create $v_{ac}$, encircles any suitable battery cable. Alternatively, CT 140 may be placed on the connecting cable between any of the battery cells, e.g., cells 142 and 144. Now the battery cable serves as the primary winding of the CT 140, and current $i_b$ passing through the battery cable induces signal $v(i_b)$ across the leads of the core winding.

Signals $v(i_b)$ and $v(v_b)$ are next passed through individual filters 160, 162, which block low-frequency noise signals, such as the 60- and 120-hertz ripple signals present in the outputs of some battery chargers. The filters 160, 162 incorporate an operational amplifier, such as the LM324 I.C., and associated values of resistance and capacitance associated with the I.C. form an R-C bandpass filter, with a center frequency at approximately 8 KHz and a bandpass of approximately 1 KHz. The filtered $v(i_b)$ and $v(v_b)$ signals are next converted to DC voltages $V_{DC}(i_b)$ and $V_{DC}(v_b)$, respectively, using integrated circuit (I.C.) RMS-to-DC converters 170, 172, such as the AD536 I.C., which produces a highly accurate DC output voltage equal to the RMS value of a periodic alternating signal.

The float voltage across the positive and negative DC bus terminals of the battery bank is divided by a voltage divider circuit 180, 182 to produce a scaled-down analog or representative signal, $V_f$, which is typically 10% of the nominal DC float voltage.

Voltages $V_{DC}(i_b)$, $V_{DC}(v_b)$ and $V_f$ are subsequently connected to separate input channels of a multiplexing switch MUX 210 (See FIG. 4) for these analog or representative signals. Other inputs to the multiplexing switch 210 may include the output signals of sensors that measure the temperatures of the battery electrolyte and ambient air and transducers for measuring the magnitude and direction of direct current through the battery bank. The AlbérCorp Battery Performance Monitor BPM Series may be used to generate these further monitoring signals. Transducers which monitor DC charging and discharging currents generate signals in a range of –5.0 to +5.0 volts DC. Ambient temperature sensors generate signals in a DC voltage range of –5.0 to +5.0 volts. DC bus to ground voltage sensors generate signals in a range of –5.0 volts to +5.0 volts DC.

Under the control of the microcomputer's EPROM program instructions (in EPROM 212), the microprocessor 213 directs each of the analog input signals to be passed serially through the multiplexing switch 210 to an analog-to-digital (A/D) converter 216, which converts the selected analog value on line 218 to a corresponding digital quantity and places the digital signal on the digital bus or other buses. As each digital quantity is generated, it is stored in a register or in memory. Registers are found in microprocessor 214. Memory 220 may also be utilized. Once all of the sampled analog signals have been converted to digital values and stored in registers, comparison and processing will take place according to program logic under direction of the microprocessor unit 214.

Further details of FIG. 3 follow. The core of each current transformer (CT) 112 consists of two symmetrical, semi-cylindrical sections, similar to a doughnut cut across its diameter. The CT cores are made from a ferrite material. Each core section is wound with insulating tape, to prevent abrasion of the enamel insulation on the 9 turns of #24 AWG magnet wire wound on each section. Each section is further mounted on printed circuit boards, with cutouts designed so that when the two sections are pressed together, the core sections are approximately contiguous, with a small air gap created by the tape. The air gap is important in that it prevents saturation of the core material, which would cause erratic oscillator behavior. The core sections are further encapsulated in an epoxy potting compound. One circuit board is further fitted with a pin jack, while the other is fitted with a pin, so that when the core sections are pressed together from opposite sides of the battery cable, the separate core windings are electrically connected to form a CT of 18 turns, with the battery cable passing through the central hole, or "window" of the CT. The overall effect is to place an 18-turn, audio frequency current transformer around the battery cable without having to open any battery connections. This is an important feature of the battery monitor system of the present invention, because it allows the battery to remain on line during the installation process and minimizes the hazards of disconnecting and reconnecting cable to the battery terminals.

When the CT 112 is connected in parallel with a 0.4 microfarad capacitor, the combination has a natural resonant frequency of approximately 8 KHz. The current passing through the windings of the CT 112 connected to the oscillator 111 induces a steady-state, sinusoidal signal current, $i_b$, at a frequency of approximately 8 KHz, into the battery cable. Current $i_b$ passes through a series combination of impedances, consisting essentially of the battery bank impedance, and the impedance presented by the parallel combination of the battery charger's output circuit and the equipment load. A second CT 140, identical in design and construction to the first, is used to detect signal $i_b$ as it enters the battery bank, and the output voltage, $v(i_b)$ across the windings of this CT 140 is proportional to the amplitude of $i_b$.

As the 8 KHz signal current $i_b$ passes through the battery bank 124, it also creates an 8 KHz voltage, $v_b$, by Ohm's Law, across the battery bank's impedance. Voltage $v_b$ is sensed by an audio frequency isolation transformer 114, with a 1:1 turns ratio, and having a single piece core made of the same type of ferrite material as the previously described in connection with CT's 112, 140. The input leads of the audio frequency CT 114 are connected, via coupling capacitors 116, 118, to the positive and negative DC bus terminals 120, 122 of the battery bank 124. The capacitors 116, 118 prevent the battery bank 124 from discharging through the input winding of the isolation transformer 114. The output of the isolation transformer 114 is voltage signal $v(v_b)$.

There is nothing special about the 8 KHz. It is the frequency used in a preferred embodiment of the present invention using off-the-shelf components. Any frequency in the range of about 20 KHz may be appropriate in the present monitor.

The R-C active bandpass filters 160, 162 for both $v(i_b)$ and $v(v_b)$ are simple two-pole type filters, using one stage of an LM324 I.C. quad op-amp, plus associated resistors and capacitors. Similar filter circuits may be found in Motorola Semiconductor's application notes for op amps. The filter is designed for unity gain at a center frequency of 8 KHz. For a given input voltage amplitude, the output voltage amplitude at 7 KHz and 9 KHz falls to approximately 0.7 times the amplitude at 8 KHz. Thus, the filter has a bandpass from approximately 7 KHz to 8 KHZ and a Q of approximately 4.

The RMS-to-DC converter for each stage (units 170, 172) is a monolithic, precision I.C., the AD536, manufactured by Analog Devices. The filtered sine waves enter the respective portion of the AD536 and emerge as DC levels $V_{DC}(i_b)$ and $V_{DC}(v_b)$. These DC signals are subsequently passed to separate input channels of a multiplexing switch 210 (FIG. 4) for comparison and processing by the microcomputer 214. Signals $v(i_b)$ and $v(v_b)$ are initially adjusted so that $V_{DC}(i_b)$ exceeds $V_{DC}(v_b)$. When the resistance of the battery conduction path has increased by about 0.5 milliohms from its initial value, $V_{DC}(v_b)$ will exceed $V_{DC}(i_b)$, and when this condition persists, without any reversal, for a preset number of sampling cycles, an alarm will be activated by the microcomputer. Alternatively a timer may be incremented every time the voltage exceeds the current. When the timer reaches a predetermined duration, an alarm is issued.

Figure 4:
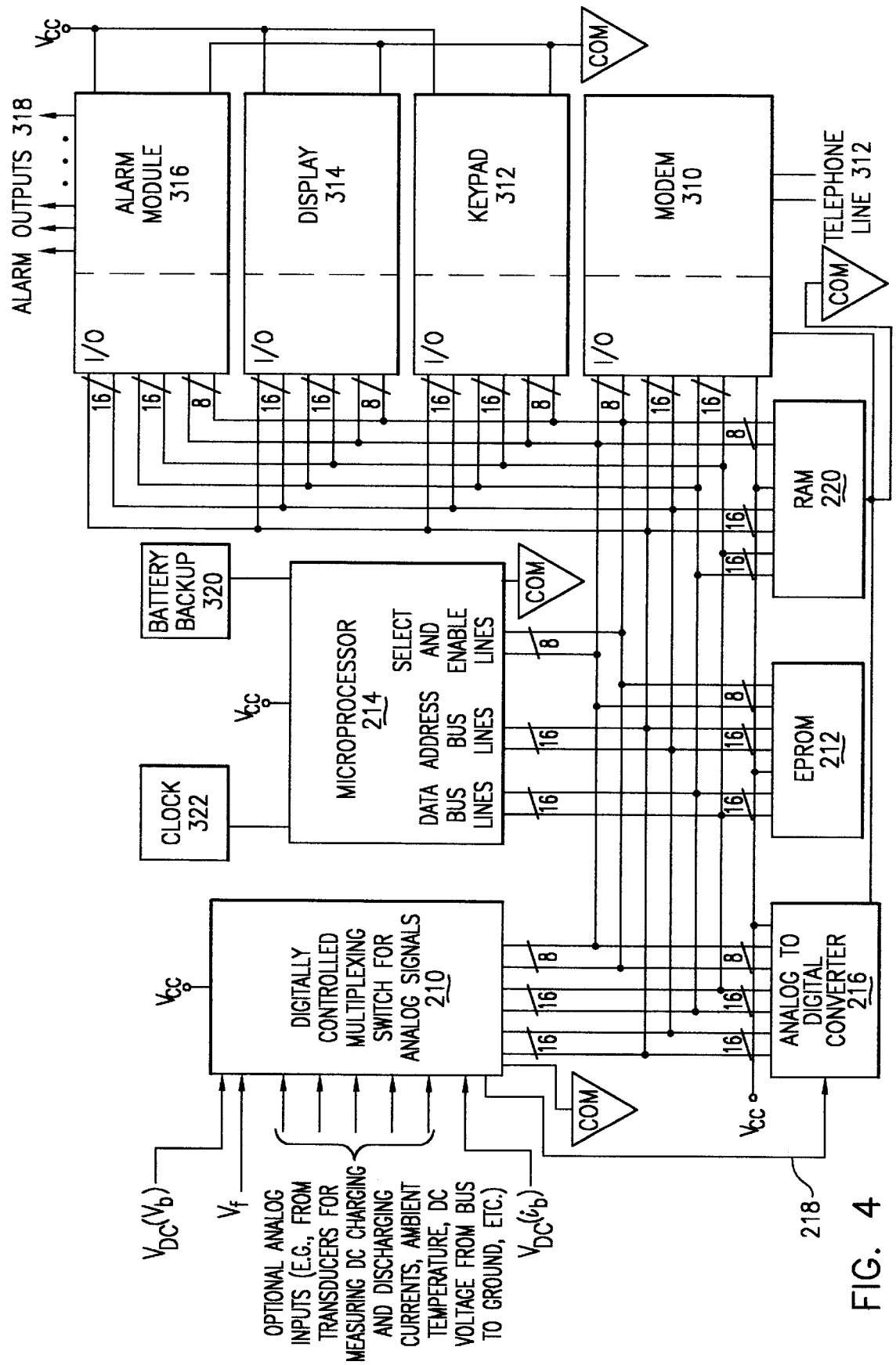
FIG. 4 diagrammatically illustrates the digital components of the system in accordance with the principles of the present invention.

With respect to FIG. 4, the microprocessor periodically polls or samples multiplexing switch 210 in order to empty its buffers and obtain digital signals representative of the analog signals applied to the input of MUX 210. Analog to Digital converter 216 is activated by microprocessor 214 to enable/disable control lines and to convert these representative sensory signals into digital signals. These digital signals, representative of $V_{DC}(v_b)$ and $V_{DC}(i_b)$ and $V_f$, among others, are temporarily stored in RAM or memory unit 220. Microprocessor 214 operates under program instructions loaded into an erasable, programmable read only memory or EPROM 212. Memory unit 212 may be programmed via modem 310 and telephone or telecommunications lines 312 or the program may be permanently stored in memory unit 212 at the factory. The operator can change signal parameters and signal limits via keypad 312. Alternatively, the parameters, limits and boundary values may be changed via modem 310. Display 314 preferably is an LCD display. Alarm module 316 provides an interface to activate relays or other alarm outputs 318. These units, modem 310, keypad 312, display 314 and alarm module 316 include input/output interfaces in order to communicate with microprocessor 214. Microprocessor 214 includes a battery back-up 320 and a clock 322.

Figure 5:
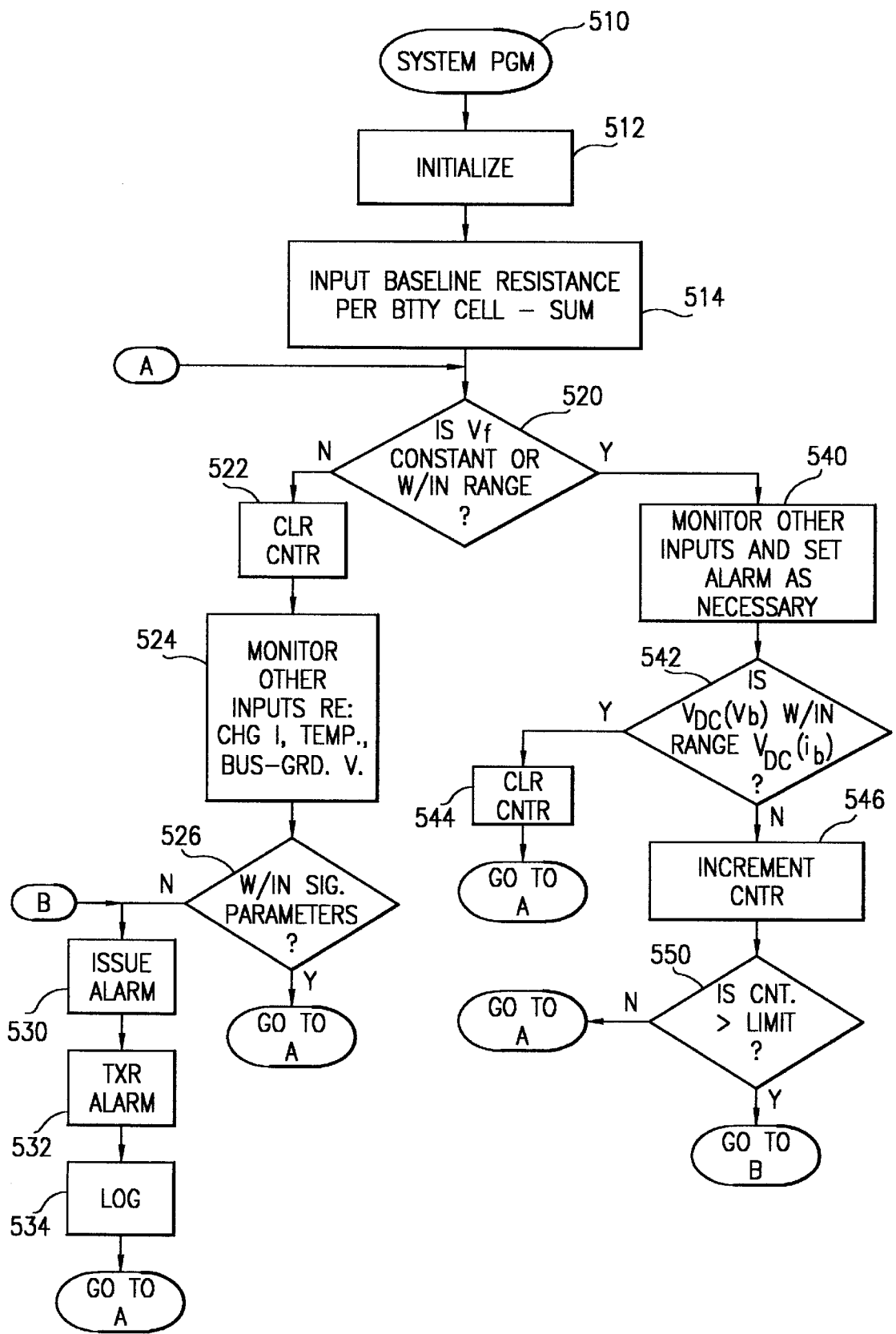
FIG. 5 diagrammatically illustrates a flow chart showing one embodiment of the system program.

FIG. 5 diagrammatically illustrates a basic flow chart for the system program 510. In step 512, the system is initialized. In step 514 the operator inputs the baseline resistance of each battery cell. This step is optional. The program then adds or sums these cell values.

Decision step 520 determines if the floating voltage representative signal $V_f$ is constant or is within a predetermined range. As discussed earlier, if the battery bank is being charged or is discharging energy to the load, $V_f$ is not constant and falls outside of the range. Of course, since this is a digital system, the voltage $V_f$ must fall outside of the predetermined range for a predetermined period of time. For example, if the battery bank is being recharged or the battery bank is discharging energy to the load, $V_f$ may be 120 volts. When the battery bank is not recharging and is not discharging, $V_f$ typically may be 133 volts. When $V_f$ is at that level or within a predetermined range about 133 volts, for a predetermined period of time, the YES branch is taken and the microprocessor 215 begins monitoring $V_{DC}(v_b)$ and $V_{DC}(i_b)$.

When the floating voltage $V_f$ is not within the predetermined range for a predetermined period of time, the NO branch is taken and the program executes step 522 which is the clear counter step. As described above, when $V_{DC}(v_b)$ as compared with $V_{DC}(i_b)$ is outside a predetermined range or boundary values, a counter is incremented. This range is the absence of a positive differential between voltages derived from the signal current and the signal voltage at the audio frequency. When the count in the counter exceeds a predetermined level, an alarm is sounded. If the float voltage $V_f$ indicates a recharging of the battery bank or a discharging of the battery bank into the load, the counter register microprocessor 214 is cleared in step 522. In other words, during recharging or discharging cycles, the system does not monitor $V_{DC}(v_b)$ and $V_{DC}(i_b)$.

After the counter is cleared in step 522, the system executes step 524 which involves monitoring other inputs. These other inputs are supplied to MUX 210. These other inputs include transducer outputs from the charging or discharging current I, the ambient temperature and the bus-to-ground voltage. In decision step 526, a determination is made whether those signals fall within certain signal parameters. If YES, the system returns to jump point A, a point preceding decision step 520. If not, the NO branch is taken from decision step 526 and in step 530 an alarm is issued. In step 532, a transmission via telecommunication line 312 and modem 310 is made. In step 534 a log or recording is made. Thereafter, the system returns via jump point A to a point immediately preceding decision step 520. Of course, the microprocessor may log all incidents when the sensory signals fall outside the boundary or limit parameters. This "alarm condition" log may be periodically uploaded to a central computer via modem 310.

Returning to decision step 520, if the float voltage $V_f$ is within range, the system in step 540 monitors the other inputs and sets or issues an alarm as necessary. These other inputs are discussed above in connection with step 524. In decision step 542, a determination is made whether $V_{DC}(v_b)$ is within a predetermined range of $V_{DC}(i_b)$. As discussed earlier, the monitoring system is adjusted such that $V_{DC}(v_b)$ is about 50 millivolts less than $V_{DC}(i_b)$. In general, $V_{DC}(i_b)$ and $V_{DC}(v_b)$ will vary in the following manner during normal battery operation. If the amplitudes of $i_b$ and $v_b$ should increase, due to a temporary upward drift in the amplitude of the output signal from oscillator 42 (FIG. 1), then $V_{DC}(i_b)$ and $V_{DC}(v_b)$ will both increase, in roughly the same proportion. If the amplitudes of $i_b$ and $v_b$ should decrease, due to a temporary downward drift in the amplitude of the output signal from oscillator 42, then $V_{DC}(i_b)$ and $V_{DC}(v_b)$ will both decrease, in roughly the same proportion. In either case, the voltage differential between representative signals $V_{DC}(i_b)$ and $V_{DC}(v_b)$ will be maintained at a non-alarming level. Also, if the load impedance $Z_L$ of the DC system is increased, then the amplitudes of both $i_b$ and $v_b$ will decrease, causing both $V_{DC}(i_b)$ and $V_{DC}(v_b)$ to decrease, in roughly the same proportion. If the load $Z_L$ of the DC system is decreased, then the amplitudes of both $i_b$ and $v_b$ will increase, causing both $V_{DC}(i_b)$ and $V_{DC}(v_b)$ to increase in roughly the same proportion. Thus the voltage differential between representative signals $V_{DC}(i_b)$ and $V_{DC}(v_b)$ will be maintained at a non-alarming level regardless of changes in the load of the DC system, up to the current limit of the battery charger 4 (FIG. 1).

It is believed that when the battery deteriorates, the resistance in the battery increases. In such situation, $V_{DC}(v_b)$ increases while $V_{DC}(i_b)$ decreases. Decision step 542 makes that determination based upon a comparison or a relational analysis or based upon similar mathematical algorithms. If $V_{DC}(v_b)$ is within the predetermined range of $V_{DC}(i_b)$, the YES branch is taken and, in step 544, the counter is cleared. Thereafter, the system returns to jump point A, a point immediately preceding decision step 520. If $V_{DC}(v_b)$ is not within the predetermined range of $V_{DC}(i_b)$, the NO branch is taken and, the system in step 546, increments the counter. Thereafter, decision step 550 determines whether the count in the counter is greater than the preset limit. If not, the program returns to jump point A immediately preceding decision step 520. If the count is greater than the threshold or limit, the YES branch is taken and the system jumps to jump point B immediately preceding the issue alarm step 530.

After the issue alarm step 530, the system transmits or announces the alarm via telecommunication system in step 532 and logs the alarm in step 534. The system then returns to jump point A immediately preceding decision step 520 which monitors the float voltage $V_f$.

It is important to note that there are other software routines which could monitor $V_{DC}(v_b)$ and $V_{DC}(i_b)$. Rather than a counter, a timer could be set to monitor the total amount of time that $V_{DC}(v_b)$ is greater than $V_{DC}(i_b)$. As stated earlier, $V_{DC}(i_b)$ is normally greater than $V_{DC}(v_b)$. Also, the software system can be configured with discrete logic components such as a comparators and operational amplifiers to accomplish the same result. An analog circuit may also be used to monitor voltage and current differentials.

Alternatively, the system could monitor the difference between $V_{DC}(v_b)$ and $V_{DC}(i_b)$. Also, the system could be adjusted such that the alarm threshold occurs when $V_{DC}(v_b)$ plus a predetermined value minus $V_{DC}(i_b)$ is equal to 0. The microprocessor based system could monitor that algorithm and when $V_{DC}(v_b)$ plus the predetermined value minus $V_{DC}(i_b)$ is less than 0, a counter could be incremented (as discussed above) or the microprocessor could simply set a clock and monitor the total amount of time that algorithm generates a value less than 0. When the clock exceeds a predetermined value or duration, the alarm would be issued. A typical time or count for this system to issue an alarm is about 30 minutes. In other words, if $V_{DC}(v_b)$ is greater than $V_{DC}(i_b)$ for over 30 minutes, an alarm would be issued. Of course, this count or incremented time value could be set by the operator from 0 minutes to 120 minutes.

The claims appended hereto are meant to cover modifications and changes within the scope and spirit of the present invention.

What is claimed is:

1. A method for detecting a deteriorating condition in a plurality of serially connected batteries utilized as a bank of standby batteries coupled in parallel to a battery charger and a DC powered load between a first and a second battery bus comprising the steps of:

providing a first audio frequency current transformer for injecting a predetermined signal current and a second audio frequency current transformer for sensing a resultant current signal;

injecting an audio frequency current as said predetermined signal current via said first audio frequency current transformer into one of said first and second battery busses;

detecting a current signal at said audio frequency and carried by said one battery bus as said resultant current signal via said second audio frequency current transformer and generating a representative current signal which is related to said injected audio frequency current signal;

detecting a voltage drop, at said audio frequency, across said first and second battery busses and generating a representative voltage signal which is related to said injected audio frequency current signal;

when said bank of standby batteries is in a normal, stable operating condition, not when said bank is in a recharging state nor when said bank is supplying DC power to said load in a discharging state, establishing a differential relationship between the representative voltage and the representative current signals; and, determining when said differential relationship exceeds at least one predetermined value and issuing an alarm signal thereat.

2. A method for detecting a deteriorating condition in a standby battery bank as claimed in claim 1 including the step of monitoring an electromagnetic characteristic of said one battery bus during the step of detecting said audio frequency current signal.

3. A method for detecting a deteriorating condition in a standby battery bank as claimed in claim 2 wherein the step of detecting said voltage drop at said audio frequency includes the steps of transforming, at said audio frequency, a voltage differential present across said first and second battery busses which is related to said injected audio frequency current signal.

4. A method for detecting a deteriorating condition in a standby battery bank as claimed in claim 3 wherein the step of detecting said voltage drop at said audio frequency includes the step of isolating only AC signals during the step of transforming, at said audio frequency, said voltage differential.

5. A method for detecting a deteriorating condition in a standby battery bank as claimed in claim 1 including the steps of monitoring a DC voltage differential across said first and second battery busses and determining when said bank is in said recharging state and when said bank is supplying DC power to said load in said discharging state based thereon.

6. A method for detecting a deteriorating condition in a standby battery bank as claimed in claim 5 wherein the step of determining when said bank is recharging or discharging includes the step of comparing said DC voltage differential to at least an upper and a lower threshold level and determining when said bank is recharging or discharging based upon whether said DC voltage differential falls within or without said upper and lower threshold levels and the method further including the step of blocking the step of issuing said alarm signal when said bank is either recharging or discharging.

7. A method for detecting a deteriorating condition in a standby battery bank as claimed in claim 4 including the steps of monitoring a DC voltage differential across said first and second battery busses and determining when said bank is in said recharging state and when said bank is supplying DC power to said load in said discharging state based thereon.

8. A method for detecting a deteriorating condition in a standby battery bank as claimed in claim 7 wherein the step of determining when said bank is recharging or discharging includes the step of comparing said DC voltage differential to at least an upper and a lower threshold level and determining when said bank is recharging or discharging based upon whether said DC voltage differential falls within or without said upper and lower threshold levels and the method further including the step of blocking the step of issuing said alarm signal when said bank is either recharging or discharging.

9. A method for detecting a deteriorating condition in a standby battery bank as claimed in claim 8 including the step of converting said representative voltage signal and said representative current signal and said DC voltage differential into corresponding digital signals, and wherein the steps of determining whether said bank is recharging or discharging and the step of establishing a differential relationship and the step of determining when said differential relationship exceeds said predetermined value is conducted in a digital format.

10. A method for detecting a deteriorating condition in a standby battery bank as claimed in claim 9 wherein said audio frequency is in a range less than 20 KHz.

11. A method for detecting a deteriorating condition in a standby battery bank as claimed in claim 10 including the step of monitoring an amount of time said differential relationship exceeds said predetermined value and delaying said issuance of said alarm until said time exceeds a predetermined duration.

12. A method for detecting a deteriorating condition in a standby battery bank as claimed in claim 1 including the step of monitoring an amount of time said differential relationship exceeds said predetermined value and delaying said issuance of said alarm until said time exceeds a predetermined duration.

13. A method for detecting a deteriorating condition in a plurality of serially connected batteries utilized as a bank of standby batteries coupled in parallel to a battery charger and a DC powered load between a first and a second battery bus comprising the steps of:

provide a first audio frequency current transformer for injecting a predetermined signal current and a second audio frequency current transformer for sensing a resultant current signal;

injecting an audio frequency current as said predetermined signal current via said first audio frequency current transformer into one of said first and second battery busses;

detecting a current signal at said audio frequency and carried by said one battery bus as said resultant current signal via said second audio frequency current transformer and generating a representative current signal which is related to said injected audio frequency current signal;

detecting a voltage drop, at said audio frequency, across said first and second battery busses and generating a representative voltage signal which is related to said injected audio frequency current signal;

comparing the representative voltage and the representative current signals when said bank of standby batteries is in a normal, stable operating condition, and issuing an alarm signal when a result of said comparison falls outside of predetermined boundary values.

14. A method for detecting a deteriorating condition in a standby battery bank as claimed in claim 13 including the step of monitoring an amount of time said result of said comparison falls outside said predetermined boundary values and delaying said issuance of said alarm until said time exceeds a predetermined duration.

15. A battery resistance monitor for detecting a deteriorating condition in a plurality of serially connected batteries utilized as a bank of standby batteries coupled in parallel to a battery charger and a DC powered load between a first and a second battery bus comprising:

means for generating and injecting, via an electromagnetic coupling with a first audio frequency current transformer, an audio frequency current into one of said first and second battery busses;

an audio frequency current detector configured as a second audio frequency current transformer, electromagnetically coupled to said one battery bus, detecting a presence of an audio frequency current signal carried by said one battery bus and matching said injected audio frequency current signal;

an audio frequency voltage transformer and detector, capacitively coupled across said first and second battery busses, detecting a voltage drop at said audio frequency, across said first and second busses;

a first and a second converter, respectively coupled to said current detector and said voltage detector, for generating corresponding representative current and representative voltage signals;

a comparing means, coupled to said converters, for determining when a differential relationship between said representative voltage signal and said representative current signal falls outside at least one predetermined boundary value and generating an alarm signal thereupon.

16. A battery monitor as claimed in claim 15 including a timer, coupled to said comparing means, for clocking a duration of said alarm signal, and means, coupled to said timer, for announcing an alarm when said duration exceeds a predetermined value.

17. A battery monitor as claimed in claim 16 wherein said means for comparing and said timer and said means for announcing are part of a microprocessor system which receives said representative current and voltage signals.

18. A battery monitor as claimed in claim 15 including means for determining when said bank of standby batteries is in a normal, stable operating condition, not when said bank is in a recharging state nor when said bank is supplying DC power to said load in a discharging state and means for enabling said comparing and alarm signal generation means thereupon.

19. A battery monitor as claimed in claim 17 including means, as part of said microprocessor system, for determining when said bank of standby batteries is in a normal, stable operating condition, not when said bank is in a recharging state nor when said bank is supplying DC power to said load in a discharging state and means, as part of said microprocessor system, for enabling said comparing and alarm signal generation means thereupon.

20. A battery monitor as claimed in claim 15 wherein said means for generating and injecting, said current detector and said voltage detector all utilize a respective split core transformer.

21. A battery monitor as claimed in claim 20 wherein said first and second converters convert a respective sinusoidal signal into a corresponding DC signal, and the monitor including first and second filter, respectively coupled between said current detector and said voltage detector and the corresponding first and second converters.

* * * * *